United States Patent
Huang et al.

(10) Patent No.: US 12,169,223 B2
(45) Date of Patent: Dec. 17, 2024

(54) METHOD AND APPARATUS FOR BATTERY SOC CORRECTION, AND BATTERY MANAGEMENT SYSTEM

(71) Applicant: Jiangsu Contemporary Amperex Technology Limited, Jiangsu (CN)

(72) Inventors: Shan Huang, Jiangsu (CN); Shichao Li, Jiangsu (CN); Mingshu Du, Jiangsu (CN); Guangyu Xu, Jiangsu (CN)

(73) Assignee: JIANGSU CONTEMPORARY AMPEREX TECHNOLOGY LIMITED, Changzhou (CN)

( * ) Notice: Subject to any disclaimer, the term of this patent is extended or adjusted under 35 U.S.C. 154(b) by 215 days.

(21) Appl. No.: 17/979,760

(22) Filed: Nov. 3, 2022

(65) Prior Publication Data

US 2023/0047373 A1    Feb. 16, 2023

Related U.S. Application Data

(63) Continuation of application No. PCT/CN2021/138559, filed on Dec. 15, 2021.

(30) Foreign Application Priority Data

Jan. 5, 2021   (CN) .......................... 202110005195.9

(51) Int. Cl.
*G01R 31/367*   (2019.01)
*G01R 31/3835*  (2019.01)
*G01R 35/00*    (2006.01)

(52) U.S. Cl.
CPC ....... *G01R 31/367* (2019.01); *G01R 31/3835* (2019.01); *G01R 35/005* (2013.01)

(58) Field of Classification Search
CPC . G01R 31/3835; G01R 35/005; G01R 31/367
See application file for complete search history.

(56) References Cited

U.S. PATENT DOCUMENTS 9,121,909 B2 *   9/2015  Liu .................... G01R 31/3828
2011/0012604 A1 * 1/2011  Tsujiko ............... H01M 4/5825
                                                           324/427

FOREIGN PATENT DOCUMENTS

CN     101981750 A      2/2011
CN     103616646 A      3/2014
(Continued)

OTHER PUBLICATIONS

PCT International Search Report for PCT/CN2021/138559, dated Mar. 1, 2022, 13 pages.
(Continued)

*Primary Examiner* — Jermele M Hollington
*Assistant Examiner* — Taqi R Nasir
(74) *Attorney, Agent, or Firm* — East IP P.C.

(57) ABSTRACT

Embodiments of the present application provide a method and an apparatus for battery SOC correction, and a battery management system, which relate to the technical field of batteries. The method includes: acquiring a voltage-SOC variation curve of a battery during a charging process; generating a voltage differential curve of the battery according to the voltage-SOC variation curve, the voltage differential curve being a variation curve of a differential value with SOC, the differential value being a ratio of a voltage variation to a SOC variation corresponding to the voltage variation during the charging process; determining a peak point on the voltage differential curve, the peak point being (Continued)

between any two adjacent plateaus on the voltage-SOC variation curve and not located on the any two adjacent plateaus; performing SOC correction on the basis of the peak point. This method is used to improve the SOC estimation accuracy.

18 Claims, 3 Drawing Sheets

(56) References Cited

FOREIGN PATENT DOCUMENTS

| CN | 104730468 A | 6/2015 |
|----|-------------|--------|
| CN | 104991189 A | 10/2015 |
| CN | 104991189 B | 10/2017 |
| CN | 104730468 B | 12/2017 |
| CN | 109782188 A | 5/2019 |
| CN | 108226783 B | 12/2019 |
| CN | 110673039 A | 1/2020 |
| CN | 110716141 A | 1/2020 |
| CN | 110895310 A | 3/2020 |
| CN | 110967631 A | 4/2020 |
| CN | 110967644 A | 4/2020 |
| CN | 111509313 A | 8/2020 |
| CN | 112327174 A | 2/2021 |
| EP | 2990818 A2 | 3/2016 |
| WO | 2020182276 A1 | 9/2020 |

OTHER PUBLICATIONS

The First Office Action for Chinese Application No. 202110005195.9, dated Feb. 18, 2021, 29 pages.
The Second Office Action for Chinese Application No. 202110005195.9, dated Mar. 16, 2021, 11 pages.
The Notification to Grant Patent Right for Invention for Chinese Application No. 202110005195.9, dated Mar. 31, 2021, 6 pages.
Hou, Chaoyong et al., Research of SOC estimation algorithm for LiFePO4 battery based on differential curves, vol. 6,No. 6, dated Nov. 30, 2017, 7 pages.
The extended European search report for European Application No. 21895925.2, dated Jun. 13, 2023, 9 pages.
Hou Chaoyong et al:"An online calibration algorithm of SOC for LiFePO4 battery by using characteristic curve", 2015 5th International Conference on Electric Utility Deregulation and Restructuring and Power Technologies (DRPT), IEEE, dated Nov. 26, 2015, 5 pages.
Luigi Ferraioli et al: "Discrete derivative estimation in LISA Pathfinder data reduction", Classical and Quantum Gravity, Institute of Physic Publishing, Bristol, GB, vol. 26, No. 9, dated May 7, 2009, 10 pages.

* cited by examiner

METHOD AND APPARATUS FOR BATTERY SOC CORRECTION, AND BATTERY MANAGEMENT SYSTEM

CROSS-REFERENCE TO RELATED APPLICATIONS

This application is a continuation of International Application No. PCT/CN2021/138559, filed on Dec. 15, 2021, which claims priority to Chinese Patent Application No. 202110005195.9, filed on Jan. 5, 2021, both of which are hereby incorporated by reference in their entireties.

TECHNICAL FIELD

The present application relates to the technical field of batteries, and in particular to a method and an apparatus for battery SOC correction, and a battery management system.

BACKGROUND

A state of charge (SOC) is used to reflect a residual energy of a battery, and a value of the SOC is a ratio of the residual capacity to the battery capacity, which is commonly expressed as a percentage ranging from 0 to 1.

Currently, a battery system with multiple plateaus (greater than or equal to 2) on their OCV (Open Circuit Voltage)—SOC curves (for example, the OCV-SOC curve of a lithium iron phosphate battery has two plateau regions) has a low SOC estimation accuracy.

SUMMARY

It is an object of the present application to provide a method and an apparatus for battery SOC correction, and a battery management system, for improving the SOC estimation accuracy.

In a first aspect, the present application provides a method for battery SOC correction, including: acquiring a voltage-SOC variation curve of a battery during a charging process; generating a voltage differential curve of the battery according to the voltage-SOC variation curve, the voltage differential curve being a variation curve of a differential value with SOC, the differential value being a ratio of a voltage variation to a SOC variation corresponding to the voltage variation during the charging process; determining a peak point on the voltage differential curve, the peak point being between any two adjacent plateaus on the voltage-SOC variation curve and not located on the any two adjacent plateaus; performing SOC correction on the basis of the peak point.

In the present application, in contrast to the prior art, in the SOC estimation, the peak point is calibrated using the variation curve of the ratio of the voltage variation to the SOC variation corresponding to the voltage variation with SOC during the charging process. First, the peak point is a peak point on the voltage differential curve, and its corresponding voltage variation is greater than the other points in the interval (that is, the interval between two adjacent plateaus). In addition, for the plateau regions, the voltage variation corresponding to the 1% SOC variation is less than 1 mV, which will cause the SOC estimation error to reach 5% or greater. Since the peak point is not on the two adjacent plateaus, the SOC estimation error corresponding to the peak point will not be significant. In the case where the voltage variation corresponding to the peak point is great and its corresponding SOC estimation error is small, the SOC correction based on the peak point is more accurate. For example, when other SOC values are corrected based on the SOC value corresponding to the peak point, since the SOC value corresponding to the peak point is accurate, the other SOC values after the correction are also accurate, so that the SOC estimation accuracy is improved.

As a possible implementation, the generating a voltage differential curve of the battery according to the voltage-SOC variation curve includes: for each time, acquiring N incremental voltages on the voltage-SOC variation curve, recording moments corresponding to the N incremental voltages, and calculating SOC variations corresponding to the N incremental voltages, where N is a positive integer greater than or equal to 5, and calculating N−1 differential values on the basis of the N incremental voltages and the SOC variations corresponding to the N incremental voltages; and generating the voltage differential curve on the basis of the N−1 differential values calculated each time.

In the present application, the incremental voltages are acquired, the SOC variations corresponding to the incremental voltages are calculated, and then the differential values are calculated to generate the voltage differential curve, so that the voltage differential curve can reflect the variation of the ratio of the voltage variation to the SOC variation with the SOC.

As a possible implementation, for N incremental voltages acquired for one time and N incremental voltages acquired for a subsequent time, the first to (N−1)th incremental voltages of the N incremental voltages for the subsequent time are the second to Nth incremental voltages of the N incremental voltages for the one time, respectively, and the Nth incremental voltage of the N incremental voltages for the subsequent time is a newly acquired incremental voltage.

In the present application, for the N incremental voltages acquired for the one time and the N incremental voltages acquired for the subsequent time, in the N incremental voltages acquired for the subsequent time, the first incremental voltage of the N incremental voltages acquired for the one time is discarded, and then one new incremental voltage is newly acquired. That is, only one new incremental voltage will be accessed for each time. By means of such sliding selection of the incremental voltages, since N−1 incremental voltages in the incremental voltages acquired for each time are included in the incremental voltages that are already accessed for the previous time, the access space for the incremental voltages can be reduced.

As a possible implementation, for each time, before the calculating N−1 differential values on the basis of the N incremental voltages and the SOC variations corresponding to the N incremental voltages, the method further includes: performing polynomial fitting on the N incremental voltages and the SOC variations corresponding to the N incremental voltages; correspondingly the calculating N−1 differential values on the basis of the N incremental voltages and the SOC variations corresponding to the N incremental voltages includes: calculating the N−1 differential values on the basis of a result of the polynomial fitting.

In the present application, the polynomial fitting is performed on the incremental voltages and their corresponding SOC variations, so that voltage filtering can be realized, so as to improve the accuracy of the finally obtained voltage differential curve.

As a possible implementation, the generating the voltage differential curve on the basis of the N−1 differential values calculated each time includes: determining a differential valid value on the basis of the N−1 differential values calculated each time; generating the voltage differential curve on the basis of the differential valid value determined each time.

In the present application, in the generation of the voltage differential curve, one differential valid value can be determined from the N−1 differential values calculated each time, so that the finally obtained voltage differential curve can be made simpler while the amount of data processing can be reduced.

As a possible implementation, the determining a peak point on the voltage differential curve includes: determining a first moment at which the voltage differential curve enters a first plateau of the two plateaus; determining a second moment at which the voltage differential curve enters a second plateau of the two plateaus, the second moment being after the first moment; determining, as the peak point, a point corresponding to a maximum differential value among differential values corresponding to respective moments between the first moment and the second moment.

In the present application, a starting position (that is, the first moment) of the first plateau and a starting position (that, the second moment) of the second plateau are defined, so that a range (interval) where the position of a peak point is located can be preliminarily defined. After the range (interval) where the position of the peak point is located is defined, in combination with the feature that the differential value corresponding to the peak point is the maximum differential value, the fast location of the peak point is achieved.

As a possible implementation, the generating a voltage differential curve of the battery according to the voltage-SOC variation curve includes: for each time, acquiring N incremental voltages on the voltage-SOC variation curve, recording moments corresponding to the N incremental voltages, calculating SOC variations corresponding to the N incremental voltages, and calculating N−1 differential values on the basis of the N incremental voltages and the SOC variations corresponding to the N incremental voltages; and generating the voltage differential curve on the basis of the N−1 differential values calculated each time; correspondingly the determining a first moment at which the voltage differential curve enters a first plateau of the two plateaus includes: determining whether a difference value between SOC increments corresponding to adjacent incremental voltages of the N incremental voltages acquired each time is greater than a preset second threshold; determining a moment corresponding to a later one of the adjacent incremental voltages as the first moment, when the difference value between the SOC increments corresponding to the adjacent incremental voltages of the N incremental voltages acquired each time is greater than the preset second threshold.

As a possible implementation, the determining a first moment at which the voltage differential curve enters a first plateau of the two plateaus includes: determining a differential valid value among the N−1 differential values calculated each time; determining whether a difference value between SOC increments corresponding to two adjacent differential valid values is greater than a preset third threshold; determining a moment corresponding to a later one of the two adjacent differential valid values as the first moment, when the difference value between the SOC increments corresponding to the two adjacent differential valid values is greater than the preset third threshold.

As a possible implementation, the determining a second moment at which the voltage differential curve enters a second plateau of the two plateaus includes: determining whether a difference value between SOC increments corresponding to adjacent incremental voltages of the N incremental voltages acquired each time after the first moment is greater than a preset fourth threshold; determining a moment corresponding to a later one of the adjacent incremental voltages as the second moment, when the difference value between the SOC increments corresponding to the adjacent incremental voltages of the N incremental voltages is greater than the preset fourth threshold.

As a possible implementation, the determining a second moment at which the voltage differential curve enters a second plateau of the two plateaus includes: determining a differential valid value among N−1 differential values calculated each time after the first moment; determining whether a difference value between SOC increments corresponding to two adjacent differential valid values is greater than a preset fifth threshold; determining a moment corresponding to a later one of the two adjacent differential valid values as the second moment, when the difference value between the SOC increments corresponding to the two adjacent differential valid values is greater than the preset fifth threshold.

In the present application, for the plateau regions, their corresponding SOC ranges can be roughly determined, and their SOC increment ranges can be determined on the basis of the SOC ranges. Therefore, the determination of the plateau regions can be realized by setting the threshold of the difference value of the SOC increments corresponding to the adjacent incremental voltages, or by setting the threshold of the difference value of the SOC increments corresponding to the adjacent differential valid values.

As a possible implementation, the performing SOC correction on the basis of the peak point includes: calibrating a SOC corresponding to the peak point, and determining the calibrated SOC corresponding to the peak point; performing the SOC correction on the basis of a SOC increment corresponding to the peak point, the calibrated SOC corresponding to the peak point, and a SOC increment corresponding to a moment at which a correction is needed.

In the present application, an accurate calibrated SOC value is determined by calibrating the peak point, thereby making the SOC value corrected according to the accurate calibrated SOC value more accurate.

In a second aspect, the present application provides an apparatus for battery SOC correction including functional modules for implementing the method as described in the first aspect and any one of the possible implementations of the first aspect.

In a third aspect, the present application provides a battery management system including: a processor; and a memory communicatively coupled to the processor; where the memory stores instructions executable by the processor, the instructions, when executed by the processor, enables the processor to perform the method as described in the first aspect and any one of the possible implementations of the first aspect.

In a fourth aspect, the present application provides a vehicle including: a battery pack and a battery management system as described in the third aspect.

In a fifth aspect, the present application provides a readable storage medium having stored thereon a computer program, where the computer program, when executed by a computer, performs the method as described in the first aspect and any one of the possible implementations of the first aspect.

By means of the technical solutions provided in the present application, the SOC estimation accuracy can be improved. In addition, the voltage differential curve can reflect the variation of the ratio of the voltage variation to the SOC variation with the SOC, so that the accuracy of the finally obtained voltage differential curve is improved, and the finally obtained voltage differential curve is simpler. Also, the access space for the incremental voltages can be reduced. Moreover, the fast location of the peak point can be achieved.

BRIEF DESCRIPTION OF THE DRAWINGS

The drawings necessary for explaining embodiments are described briefly below to illustrate the technical solutions of the embodiments of the present application more clearly. Obviously, the drawings described below are merely some embodiments of the present application. Other figures can be obtained by those with ordinary skill in the art from those drawings without any creative work.

Figure 1:
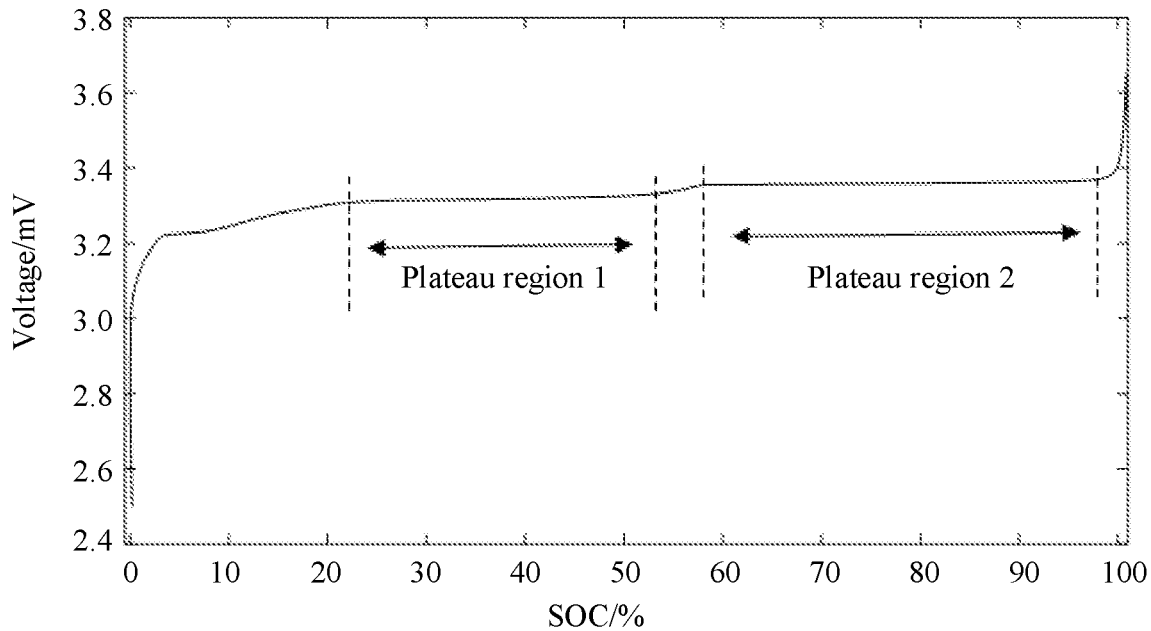
FIG. 1 is a schematic diagram of a voltage-SOC variation curve according to an embodiment of the present application.

In the drawings, the drawings are not necessarily drawn to actual scale.

Reference numerals: 400—Apparatus for battery SOC correction; 401—Acquiring module; 402—Processing module; 500—Battery management system; 501—Processor; 502—Memory.

DETAILED DESCRIPTION

Implementations of the present application are described in further detail below with reference to the drawings and embodiments. The detailed description and drawings of the following embodiments are used to exemplarily illustrate the principles of the present application instead of limiting the scope of the present application. That is, the present application is not limited to the described embodiments.

In the description of the present application, it is noted that, unless otherwise specified, the meaning of "a plurality" is two or more; the terms "upper", "lower", "left", "right", "inner", "outer", and the like indicate orientations or positional relationships merely to facilitate and simplify description of the present application, and do not indicate or imply that the devices or elements referred to must have a particular orientation, be constructed and operated in a particular orientation, and thus should not be construed as limiting the present application. In addition, the terms "first", "second", "third", and the like are used for descriptive purposes only and are not to be construed as indicating or implying relative importance. "Perpendicular" is not limited to perpendicular in the strict sense, but allows for a tolerance. "Parallel" is not limited to parallel in the strict sense, but allows for a tolerance.

The direction words appearing in the following description are directions shown in the drawings and do not limit the specific structure of the present application. In the description of the present application, it should be further noted that, unless otherwise expressly specified and limited, the terms "installed", "connected" and "connection" should be understood in a broad sense, for example, they may refer to a fixed connection, and may also refer to a detachable connection, or an integral connection; it may refer to a direct connection, and may also refer to an indirect connection through an intermediate medium. For those of ordinary skill in the art, the specific meanings of the above-mentioned terms in the present application can be understood in accordance with specific conditions.

A method for battery SOC correction provided in the embodiments of the present application can be applied to an electric vehicle. With the method, a SOC of a battery pack of the electric vehicle can be corrected.

Of course, the method can also be applied to other electrically powered devices (that is, devices in which a battery or a battery pack serves as a power source). With the method, correction of the SOC of the battery pack of other electrically powered devices can be achieved.

In either an electric vehicle or other electrically powered devices, a battery management system (BMS) is typically provided. The BMS and the battery pack constitute a battery system, and the BMS is used for managing various parameters (voltage, current, temperature, etc.) of the battery pack. The hardware environment to which the embodiments of the present application are applied may be a BMS corresponding to a battery pack.

In addition to being connected with the battery pack to realize the management of the battery pack, the BMS is also connected with other modules of the electric vehicle or the electrically powered devices (including the implementable connection relationships such as electrical connection and physical connection). Data can be transmitted between the system and these modules. For example, the BMS of the electric vehicle sends relevant parameter information about the battery pack to a central control system, and the central control system then feeds back the relevant parameter information (for example, by directly displaying). For further example, the BMS receives relevant instructions sent by the central control system, and BMS manages the battery pack according to the instructions.

The embodiments of the present application relate to the SOC correction of the battery pack. Therefore, the involved parameters of the battery pack are parameters related to the SOC of the battery pack, such as a voltage, a current and the like.

The embodiments of the present application are applied to a battery system of which the OCV-SOC curve has multiple plateaus (greater than or equal to 2), such as a lithium iron phosphate battery system, of which the OCV-SOC curve has two plateau regions. An OCV-SOC curve is a variation curve of an open-circuit voltage with a state of charge of a battery. For example, with reference to FIG. 1, which is a schematic diagram of an OCV-SOC curve of a lithium iron phosphate battery, there are two plateau regions on the curve, including a plateau region 1 and a plateau region 2. It can be seen from FIG. 1 that, in portions on the curve corresponding to plateau region 1 and plateau region 2, the voltage is in a substantially constant state, that is, the variation of the voltage in the plateau regions is small.

In the prior art, a SOC is estimated in real time using voltage values. However, for every 1% variation of SOC in the plateau region, the corresponding voltage variation is less than 1 mV, which will result in a SOC estimation error of 5% or greater. Therefore, the SOC estimation accuracy is not high. In view of this, with the technical solutions provided by the present application, the SOC estimation accuracy can be improved.

Figure 2:
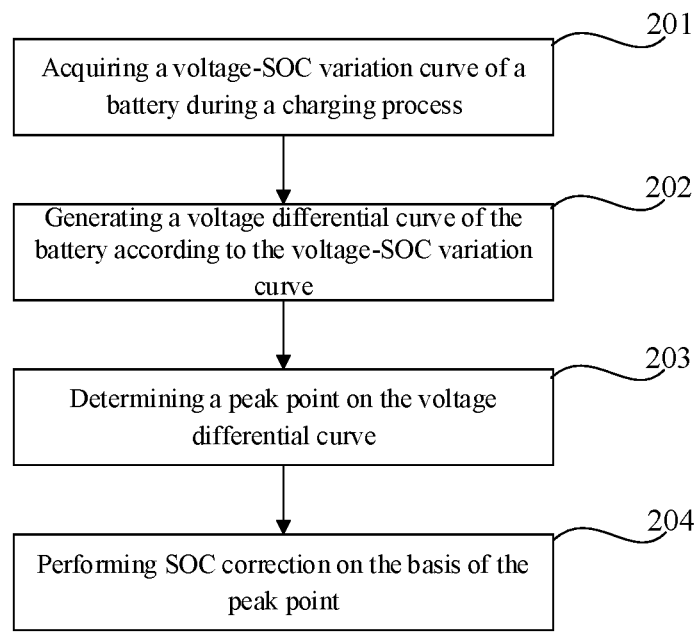
FIG. 2 is a flowchart of a method for battery SOC correction according to an embodiment of the present application.

Based on the brief description to the above application scenario, and with reference to FIG. 2, a flowchart of a method for battery SOC correction according to an embodiment of the present application includes step 201 to step 204.

At step 201, a voltage-SOC variation curve of a battery during a charging process is acquired.

At step 202, a voltage differential curve is generated from the voltage-SOC variation curve. The voltage differential curve is a variation curve of a differential value with SOC, where the differential value is a ratio of a voltage variation to a SOC variation corresponding to the voltage variation during the charging process.

At step 203, a peak point on the voltage differential curve is determined. The peak point is located between any two adjacent plateaus on the voltage-SOC variation curve and not located on the any two adjacent plateaus.

At step 204, SOC correction is performed based on the peak point.

In the embodiments of the present application, in contrast to the prior art, in the SOC estimation, the peak point is calibrated using the variation curve of the ratio of the voltage variation to the SOC variation corresponding to the voltage variation with SOC during the charging process. First, the peak point is a peak point on the voltage differential curve, and its corresponding voltage variation is greater than the other points in the interval (that is, the interval between two adjacent plateaus). In addition, for the plateau regions, the voltage variation corresponding to the 1% SOC variation is less than 1 mV, which will cause the SOC estimation error to reach 5% or greater. Since the peak point is not on the two adjacent plateaus, the SOC estimation error corresponding to the peak point will not be significant. In the case where the voltage variation corresponding to the peak point is great and its corresponding SOC estimation error is small, the SOC correction based on the peak point is more accurate. For example, when other SOC values are corrected based on the SOC value corresponding to the peak point, since the SOC value corresponding to the peak point is accurate, the other SOC values after the correction are also accurate, so that the SOC estimation accuracy is improved.

Next, the technical solutions provided by the embodiments of the present application are described in detail with reference to steps 201-204.

As an optional implementation, before step 201, a current variation of the battery may be detected in real time. When the current variation of the battery meets a condition, the correction strategy of steps 201-204 is performed. When the current variation of the battery does not meet the condition, the correction strategy of steps 201-204 is not performed. Specifically, when it is detected that the current variation of the battery is less than a first threshold, step 201 is performed.

The first threshold can be understood as a small value of current variation. When the battery is in a state where its current varies mildly, its voltage does not suddenly increase or decrease by a large amplitude. Therefore, the increase amplitude or the decrease amplitude does not exceed the sampling precision range of voltage. As an optional implementation, the first threshold is 5A. In practice, the current threshold may be set in consideration of the specific condition of the battery, and will not be limited in the embodiments of the present application.

At step 201, the voltage-SOC variation curve of the battery during the charging process is acquired. During the charging process, the state change of the battery (including voltage and current, etc.) is monitored by the BMS. Therefore, step 201 can be understood as generating the voltage-SOC variation curve of the battery according to state information during the charging process.

At step 202, the voltage differential curve of the battery is generated on the basis of the voltage-SOC variation curve. The voltage differential curve is a variation curve of the differential value with the SOC. The differential value can be understood as the ratio of the voltage variation to the SOC variation corresponding to the voltage variation during the charging process.

In view of the definition of the voltage differential curve, in the generation of the curve, it is necessary to record the voltage variations during the charging process, to record SOC variations corresponding to the voltage variations, and to record the SOCs corresponding to the SOC variations and the voltage variations. With different manners of voltage selection, the corresponding SOC variations are different, and the generated voltage differential curve is also different.

As an optional implementation, step 202 includes: for each time, acquiring N incremental voltages on the voltage-SOC variation curve, recording moments corresponding to the N incremental voltages, and calculating SOC variations corresponding to the N incremental voltages; calculating N−1 differential values on the basis of the N incremental voltages and the SOC variations corresponding to the N incremental voltages; and generating the voltage differential curve on the basis of the N−1 differential values calculated each time.

The incremental voltage refers to a voltage that is greater than a previously acquired voltage. For example, if the voltage acquired previously is 1V, the voltage currently acquired should be greater than 1V to become an incremental voltage. The SOC variation corresponding to the incremental voltage refers to the variation between the SOC corresponding to the current incremental voltage and the SOC corresponding to the previous incremental voltage.

According to the definition of the differential value, in the calculation of the differential value, first the variation between the current incremental voltage and the previous incremental voltage is calculated, then the variation between the SOC corresponding to the current incremental voltage and the SOC corresponding to the previous incremental voltage is calculated, and then the ratio of the voltage variation and the SOC variation is calculated. The obtained ratio is the differential value. It will be appreciated that, a total of N incremental voltages are acquired for one time. But the variation is related to two incremental voltages, so that the number of the finally calculated differential values is N−1.

N is a positive integer greater than or equal to 5. In practice, N can be appropriately set according to the processing capability of the battery management system. The value of N may be greater when the processing capability is stronger. The value of N may be smaller when the processing capability is poorer. As an optional value, N=5.

In this embodiment of the present application, the incremental voltages and the SOC variations corresponding to the incremental voltages are acquired, and then the differential values are calculated to generate the voltage differential curve, so that the voltage differential curve can reflect the variation of the ratio of the voltage variation to the SOC variation with SOC.

Preferably, the incremental voltage may also be selected in a sliding manner. In the sliding selection manner, only a part of the N incremental voltages acquired each time are newly acquired incremental voltages, and the other part of the incremental voltages uses a part of the previously acquired incremental voltages. For example, letting the N incremental voltages acquired for the first time be V1-V5, then the N incremental voltages acquired for the second time are V2-V6; alternatively, letting the N incremental voltages acquired for the first time be V1-V5, then the N incremental voltages acquired for the second time are V3-V7. That is, the number of newly acquired incremental voltages (the sliding selection range) can be set according to actual application scenarios.

It can be understood that, for the N incremental voltages acquired for one time and the N incremental voltages acquired for the subsequent time, if the first to (N−1)th incremental voltages of the N incremental voltages acquired for the subsequent time are the second to N-th incremental voltages of the N incremental voltages acquired for the one time, respectively, the Nth incremental voltage of the N incremental voltages acquired for the subsequent time is a newly acquired incremental voltage. By using a sliding selection with only one incremental voltage newly acquired once, the access space can be minimized since N−1 incremental voltages of incremental voltages acquired for one time are incremental voltages that have been accessed previously.

Furthermore, in practice, whether to slidingly select the incremental voltages and the specific manner for the sliding selection may be selected according to the condition of the access space of the battery management system, which will not be limited in the embodiments of the present application.

In this implementation of calculating the differential values on the basis of the N incremental voltages acquired each time, there are two implementations for the differential value on the finally generated voltage differential curve. First one of the two implementations is recording N−1 differential values corresponding to the N incremental voltages acquired each time, and generate the voltage differential curve. Second one is recording only one of the N−1 differential values for the N incremental voltages acquired each time, and generating the voltage differential curve.

In the second implementation, the generating the voltage differential curve on the basis of the N−1 differential values calculated each time includes: determining a differential valid value on the basis of the N−1 differential values calculated each time; and generating the voltage differential curve on the basis of the differential valid value determined each time.

Since what eventually needs to be determined is the peak value on the voltage differential curve, the differential valid value determined each time may be the maximum value of the N−1 differential values. As such, the finally generated voltage differential curve is made simpler while the amount of data processing is reduced.

In the embodiments of the present application, the voltage may be filtered regardless of the implementation used to generate the voltage differential curve. Taking the incremental voltage described in the previous embodiment as an example, for each time, before the calculating N−1 differential values on the basis of the N incremental voltages and the SOC variations corresponding to the N incremental voltages, the method further includes: performing polynomial fitting on the N incremental voltages and the SOC variations corresponding to the N incremental voltages. Correspondingly the calculating N−1 differential values on the basis of the N incremental voltages and the SOC variations corresponding to the N incremental voltages includes: calculating the N−1 differential values on the basis of a result of the polynomial fitting.

In this implementation, the accuracy of the finally obtained voltage differential curve can be improved by implementing voltage filtering by means of polynomial fitting. The calculation algorithm of polynomial fitting falls within common knowledge of a person skilled in the art, and will not be described in detail herein.

In addition to filtering by means of polynomial fitting, other filtering methods that can be implemented may be used for the filtering, such as, wavelet filtering, least square fitting filtering, which will not be limited in the embodiments of the present application.

Figure 3:
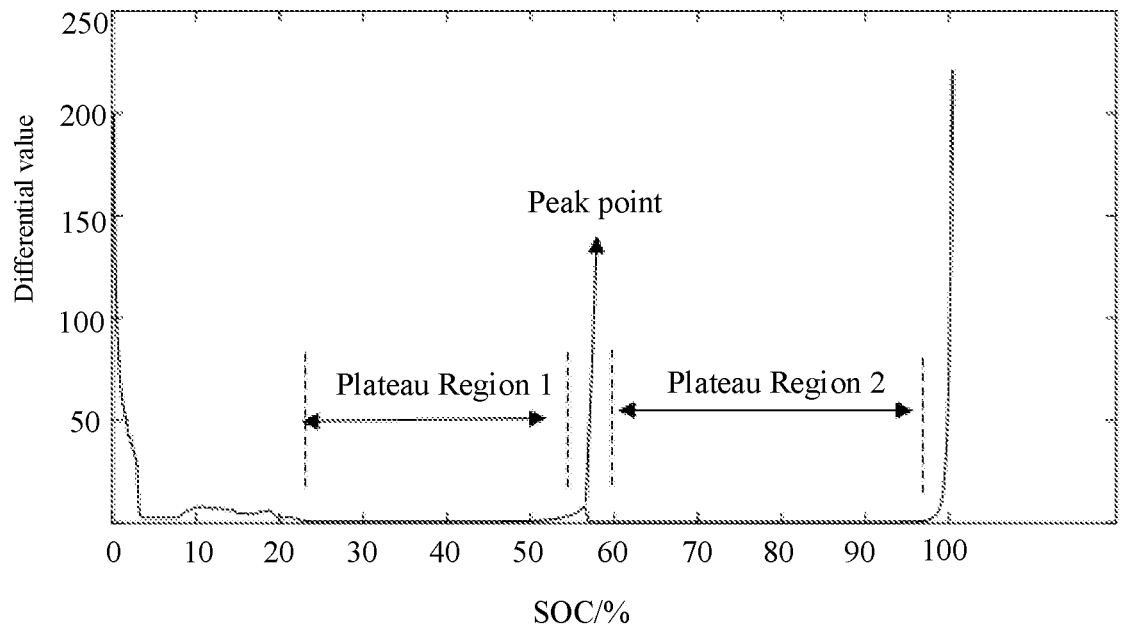
FIG. 3 is a schematic diagram of a voltage differential curve according to an embodiment of the present application.

By way of example, reference is made to FIG. 3, which is an exemplary graph of a voltage differential curve provided by an embodiment of the present application. In FIG. 3, the abscissa is SOC and the ordinate is the ratio of the voltage variation to the SOC variation. It can be seen that, the variations of SOC and voltage is significant when SOC starts to increase, and the ratio (that is, the differential value) of the voltage variation of to the SOC variation of is great. During the subsequent continuous increase of SOC, the variations of SOC and voltage tend to be mild, and the ratio (that is, the differential value) of the voltage variation to the SOC variation is small.

It should be noted that, FIG. 3 shows the complete voltage differential curve finally generated. However, in a battery management system, the process of generating the voltage differential curve is generally real-time, for example, when SOC reaches 50%, the voltage differential curve corresponds to the part of the curve from 0 to 50% SOC.

After the voltage differential curve is generated at step 202, the peak point on the voltage differential curve is determined at step 203. As an optional implementation, step 203 includes: determining a first moment at which the voltage differential curve enters a first plateau of the two plateaus; determining a second moment at which the voltage differential curve enters a second plateau of the two plateaus, the second moment being after the first moment; determining, as the peak point, a point corresponding to a maximum differential value among differential values corresponding to respective moments between the first moment and the second moment.

To facilitate understanding, FIG. 3 provides a schematic diagram of a voltage differential curve of an embodiment of the present application. In FIG. 3, a plateau region 1 and a plateau region 2 are labeled, which coincide with the plateau region 1 and the plateau region 2 in FIG. 1. Between the plateau region 1 and the plateau region 2, it can be clearly seen that there is one peak point, which is the peak point to be determined at step 203. It can be seen from the position of the peak point that the peak point is located in between the plateau region 1 and the plateau region 2, and is the point with the maximum differential value in the large interval between the plateau region 1 and the plateau region 2.

Furthermore, in the determination of the peak point, first the first moment when the voltage differential curve enters the plateau region 1 is determined, then the second moment when the voltage differential curve enters the plateau region 2 (after the first moment) is determined, and then the point corresponding to the maximum differential value among the differential values corresponding to the respective moments between the first moment and the second moment is determined, where the point corresponding to the maximum peak value is the peak point.

In this embodiment of the present application, a starting position (that is, the first moment) of the first plateau and a starting position (that, the second moment) of the second plateau are defined, so that a range (interval) where the position of a peak point is located can be preliminarily defined. After the range (interval) where the position of the peak point is located is defined, in combination with the feature that the differential value corresponding to the peak point is the maximum differential value, the fast location of the peak point is achieved.

It can be seen that, in order to achieve the determination of the peak point, the determination of the plateau region 1 and the plateau region 2 is critical. With regard to the determination of the plateau region 1 and the plateau region 2, in the embodiments of the present application, in combination with the generation method of the voltage differential curve, there are two implementations for the determination. First one is determining on the basis of SOC increments corresponding to the N incremental voltages acquired each time. Second one is determining based on the SOC increment corresponding to the differential valid value among the N−1 differential values calculated for one time and the SOC increment corresponding to the differential valid value among the N−1 differential values calculated for the subsequent time.

The two determination manners may be used at the same time, and as long as either of the determination manners determines that a plateau is entered, it can be determined that the plateau is entered. These two determination manners can also be selectively used, that is, one specific determination manner is used for a specific plateau region. In addition, the determination manners for the plateau region 1 and the plateau region 2 may be the same or different. For example, the first determination manner is used for the plateau region 1, and the second determination manner is used for the plateau region 2; or, the first and second determination manners are used for both the plateau region 1 and the plateau region 2 at the same time. Next, the two determination manners are described with regard to the plateau region 1 and the plateau region 2, respectively.

The first determination manner for the plateau region 1 includes: determining whether a difference value between SOC increments corresponding to adjacent incremental voltages in the N incremental voltages is greater than a preset second threshold; determining a moment corresponding to a later one of the adjacent incremental voltages as the first moment, when the difference value between the SOC increments corresponding to the adjacent incremental voltages in the N incremental voltages is greater than the preset second threshold.

The second threshold may be determined according to the SOC range of the battery plateau region 1. For example, the second threshold may be 5% SOC, which may be different for different batteries.

As an example, let the N incremental voltages acquired at the current time be V1-V5, and the SOC increment corresponding to V2 be the difference between the SOC corresponding to V2 and the SOC corresponding to V1 (similarly applicable for the SOC increments corresponding to other voltages). If the difference between the SOC increment corresponding to V3 and the SOC increment corresponding to V2 is greater than the second threshold, it is determined that the moment corresponding to V3 is the first moment, that is, when V3 is acquired, the plateau region 1 has been entered.

The second determination manner for the plateau region 1 includes: determining a differential valid value among the N−1 differential values calculated each time; determining whether a difference value between SOC increments corresponding to two adjacent differential valid values is greater than a preset third threshold; determining a moment corresponding to a later one of the two adjacent differential valid values as the first moment, when the difference value between the SOC increments corresponding to the two adjacent differential valid values is greater than the preset third threshold.

The third threshold may be determined according to the SOC range of the battery plateau region 1. For example, the third threshold may be 2% SOC, which may be different for different batteries.

The differential valid value is the maximum differential value among the N−1 differential values, and the moment corresponding to the differential valid value is the moment corresponding to the maximum differential value. For example, assuming that in V1-V5, the differential valid value is the differential value corresponding to V5, then the moment corresponding to the differential valid value is the moment when the incremental voltage is acquired as V5.

As an example, letting the N incremental voltages acquired for the current time be V2-V6, the N incremental voltages acquired for the previous time be V1-V5, the differential valid value of the N−1 differential values calculated for the current time be A, and the differential valid value of the N−1 differential values calculated for the previous time be B, if the difference between the SOC increment corresponding to the differential valid value A and the SOC increment corresponding to the differential valid value B is greater than the third threshold, then it is determined that the moment corresponding to the differential valid value A is the first moment. That is, when the differential valid value is calculated as A, the plateau region 1 has been entered. Assuming that the incremental voltage corresponding to the differential valid value A is V6, then the moment corresponding to V6 is the first moment.

No matter which one of the determination manners is used, for the battery management system, an identifier of the plateau region 1 may be set, and before the determination, the identifier is set to 0 (an initial value). If the plateau region 1 is determined to be entered, the identifier of the plateau region 1 is set to 1. Alternatively, if the plateau region 1 is determined to be entered using the first determination manner, the identifier of the plateau region 1 is set to 1, and if the plateau region 1 is determined to be entered using the second determination manner, the identifier of the plateau region 1 set to 2.

The first determination manner for the plateau region 2 includes: determining whether a difference value between SOC increments corresponding to adjacent incremental voltages in the N incremental voltages acquired after the first moment is greater than a preset fourth threshold; determining a moment corresponding to a later one of the adjacent incremental voltages as the second moment, when the difference value between the SOC increments corresponding to the adjacent incremental voltages in the N incremental voltages is greater than the preset fourth threshold.

The fourth threshold can be determined according to the SOC range of the battery plateau region 2. For example: the fourth threshold may be 2.5% SOC, and may be different for different batteries.

As an example, let the N incremental voltages acquired at the current time be V3-V7, and the SOC increment corresponding to V4 be the difference between the SOC corresponding to V4 and the SOC corresponding to V3 (similarly applicable for the SOC increments corresponding to other voltages). If the difference between the SOC increment corresponding to V4 and the SOC increment corresponding to V3 is greater than the fourth threshold, it is determined that the moment corresponding to V4 is the second moment, that is, when V4 is acquired, the plateau region 2 has been entered.

The second determination manner for the plateau region 2 includes: determining a differential valid value among N−1 differential values calculated after the first moment; determining whether a difference value between SOC increments corresponding to two adjacent differential valid values is greater than a preset fifth threshold; determining a moment corresponding to a later one of the two adjacent differential valid values as the second moment, when the difference value between the SOC increments corresponding to the two adjacent differential valid values is greater than the preset fifth threshold.

The fifth threshold may be determined according to the SOC range of the battery plateau region 2. For example: the fifth threshold may be 1.5% SOC, and may be different for different batteries.

As an example, letting the N incremental voltages acquired for the current time be V3-V7, the N incremental voltages acquired for the previous time be V2-V6, the differential valid value of the N−1 differential values calculated for the current time be C, and the differential valid value of the N−1 differential values calculated for the previous time be D, if the difference between the SOC increment corresponding to the differential valid value C and the SOC increment corresponding to the differential valid value D is greater than the fifth threshold, then it is determined that the moment corresponding to the differential valid value C is the second moment. That is, when the differential valid value is calculated as C, the plateau region 2 has been entered. Assuming that the incremental voltage corresponding to the differential valid value C is V7, then the moment corresponding to V7 is the second moment.

No matter which one of the determination manners is used, for the battery management system, an identifier of the plateau region 2 may be set, and before the determination, the identifier is set to 0 (an initial value). If the plateau region 2 is determined to be entered, the identifier of the plateau region 2 is set to 1. Alternatively, if the plateau region 2 is determined to be entered using the first determination manner, the identifier of the plateau region 2 is set to 1, and if the plateau region 2 is determined to be entered using the second determination manner, the identifier of the plateau region 2 set to 2.

In this embodiment of the present application, for the plateau regions, their corresponding SOC ranges can be roughly determined, and their SOC increment ranges can be determined on the basis of the SOC ranges. Therefore, the determination of the plateau regions can be realized by setting the threshold of the difference value of the SOC increments corresponding to the adjacent incremental voltages, or by setting the threshold of the difference value of the SOC increments corresponding to the adjacent differential valid values.

For the BMS, the process of determining the plateau region is real-time, and in this real-time determination process, in order to achieve the determination of the maximum differential value, after it is determined that the first plateau region is entered, the maximum differential value can be updated. The manner for updating can be understood as: for each time a differential value is calculated, it is compared to the previous differential value, with the larger differential value being the current maximum differential value. For example, when it is determined that the identifier of the plateau region 1 changes from 0 to 1 or 2, the current maximum differential value is equal to the differential value corresponding to the moment.

In order to ensure that the maximum differential value is the differential value after the first plateau region is entered, in the real-time updating process, if the moment corresponding to the maximum differential value is before the first moment, the identifier of plateau region 1 is reset from 1 or 2 to 0.

In the later process, if the identifier of the plateau region 1 is always maintained as 1 or 2, the current maximum differential value is updated in real time, so that wrong determination of the plateau region 1 can be avoided.

Further, after the second plateau region is determined to be entered, the point corresponding to the maximum differential value at that moment may be determined as the peak point. For example, if the identifier of the current plateau region 1 is 1 or 2, and the identifier of the plateau region 2 changes from 0 to 1 or 2, then the point corresponding to the current maximum differential value is the peak point.

Furthermore, in the real-time updating process of the differential peak value, the maximum differential value takes a larger differential value, so that the point corresponding to the current maximum differential value does not necessarily have to be the differential value at the current moment, that is, the current maximum differential value the differential value at the current moment. For example, assuming that at the moment corresponding to V7, the identifier of the plateau region 1 is 1 or 2, and the identifier of the plateau region 2 changes from 0 to 1 or 2, but the current maximum differential value is the differential value at the moment corresponding to V5, then the peak point is the point at which the differential value at the moment corresponding to V5 is located.

It should be noted that, it is a restrictive condition that the second moment is after the first moment. However, in the process of real-time determination, in order to ensure that the moment meets the requirements of the restrictive condition, when it is determined that the current moment meets the condition for entering the second plateau, it should also be determined whether the current moment is after the first moment, and if so, it is the second plateau is determined to be entered; if not, the second plateau is determined not to be entered.

After the determination of the peak point on the voltage differential curve is achieved through the determination of the two plateau regions at step 203, the SOC correction is performed according to the peak point at step 204.

As an optional implementation, step 204 includes: calibrating a SOC corresponding to the peak point, and determining the calibrated SOC corresponding to the peak point; performing the SOC correction on the basis of a SOC increment corresponding to the peak point, the calibrated SOC corresponding to the peak point, and a SOC increment corresponding to a moment at which a correction is needed.

The peak point corresponds to a SOC, but in order to ensure the accuracy of the SOC to be corrected, a more accurate SOC value can be determined by means of off-line calibration, and then correction is performed based on the more accurate SOC value. For example, the calibrated SOC value may be 57% SOC.

In the SOC correction, the following manner may be used for correction: SOC correction value=calibrated SOC corresponding to the peak point+(SOC increment corresponding to the current moment—SOC increment corresponding to the peak point).

The moment at which a correction is needed can be understood to be a moment after the moment of entering the second plateau (that is, the second moment).

Furthermore, in the embodiments of the present application, the SOC correction during the charging process is described, but in practice, in addition to the application during the real-time correction, the SOC correction may also be a non-real-time data correction process performed on an existing voltage-SOC curve in order to obtain more accurate data, such as correcting the SOC value of the battery pack after the charging process of the battery pack stops.

Figure 4:
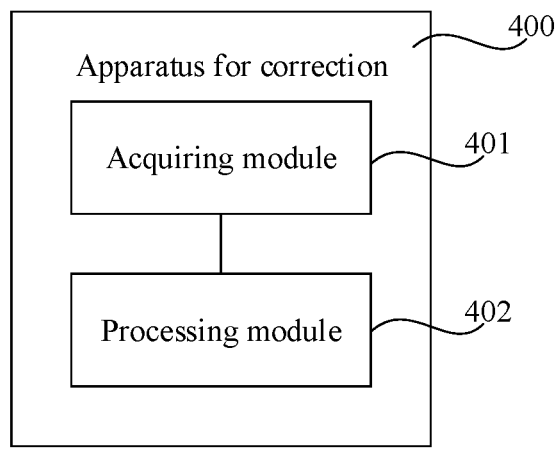
FIG. 4 is a structural diagram of an apparatus for battery SOC correction according to an embodiment of the present application.

Based on the same inventive concept, with reference to FIG. 4, the embodiments of the present application further provide an apparatus 400 for battery SOC correction including an acquiring module 401 and a processing module 402.

The acquiring module 401 is configured to acquire a voltage-SOC variation curve of a battery during a charging process. The processing module 402 configured to: generate a voltage differential curve of the battery according to the voltage-SOC variation curve, the voltage differential curve being a variation curve of a differential value with SOC, the differential value being a ratio of a voltage variation to a SOC variation corresponding to the voltage variation during the charging process; determine a peak point on the voltage differential curve, the peak point being between any two adjacent plateaus on the voltage-SOC variation curve and not located on the any two adjacent plateaus; perform SOC correction on the basis of the peak point.

In an embodiment of the present application, the processing module 402 is specifically configured to: for each time, acquire N incremental voltages on the voltage-SOC variation curve, recording moments corresponding to the N incremental voltages, and calculate SOC variations corresponding to the N incremental voltages, where N is a positive integer greater than or equal to 5, and calculate N−1 differential values on the basis of the N incremental voltages and the SOC variations corresponding to the N incremental voltages; and generate the voltage differential curve on the basis of the N−1 differential values calculated each time.

In an embodiment of the present application, the processing module 402 is further configured to: perform polynomial fitting on the N incremental voltages acquired each time and the SOC variations corresponding to the N incremental voltages; and specifically configured to: calculate the N−1 differential values on the basis of a result of the polynomial fitting.

In an embodiment of the present application, the processing module 402 is further configured to: determine a differential valid value on the basis of the N−1 differential values calculated each time; generate the voltage differential curve on the basis of the differential valid value determined each time.

In an embodiment of the present application, the processing module 402 is further configured to: determine a first moment at which the voltage differential curve enters a first plateau of the two plateaus; determine a second moment at which the voltage differential curve enters a second plateau of the two plateaus, the second moment being after the first moment; determine, as the peak point, a point corresponding to a maximum differential value among differential values corresponding to respective moments between the first moment and the second moment.

In an embodiment of the present application, the processing module 402 is further configured to: determine whether a difference value between SOC increments corresponding to adjacent incremental voltages of the N incremental voltages acquired each time is greater than a preset second threshold; determine a moment corresponding to a later one of the adjacent incremental voltages as the first moment, when the difference value between the SOC increments corresponding to the adjacent incremental voltages of the N incremental voltages acquired each time is greater than the preset second threshold.

In an embodiment of the present application, the processing module 402 is further configured to: determine a differential valid value among the N−1 differential values calculated each time; determine whether a difference value between SOC increments corresponding to two adjacent differential valid values is greater than a preset third threshold; determine a moment corresponding to a later one of the two adjacent differential valid values as the first moment, when the difference value between the SOC increments corresponding to the two adjacent differential valid values is greater than the preset third threshold.

In an embodiment of the present application, the processing module 402 is further configured to: determine whether a difference value between SOC increments corresponding to adjacent incremental voltages of the N incremental voltages acquired each time after the first moment is greater than a preset fourth threshold; determine a moment corresponding to a later one of the adjacent incremental voltages as the second moment, when the difference value between the SOC increments corresponding to the adjacent incremental voltages of the N incremental voltages is greater than the preset fourth threshold.

In an embodiment of the present application, the processing module 402 is further configured to: determine a differential valid value among N−1 differential values calculated each time after the first moment; determine whether a difference value between SOC increments corresponding to two adjacent differential valid values is greater than a preset fifth threshold; determine a moment corresponding to a later one of the two adjacent differential valid values as the second moment, when the difference value between the SOC increments corresponding to the two adjacent differential valid values is greater than the preset fifth threshold.

In an embodiment of the present application, the processing module 402 is further configured to: calibrate a SOC corresponding to the peak point, and determine the calibrated SOC corresponding to the peak point; perform the SOC correction on the basis of a SOC increment corresponding to the peak point, the calibrated SOC corresponding to the peak point, and a SOC increment corresponding to a moment at which a correction is needed.

The SOC correction apparatus 400 of the battery corresponds to the SOC correction method of the battery, and therefore, the embodiments of the respective modules of the SOC correction apparatus 400 of the battery refer to the embodiments of the respective steps of the SOC correction method of the battery, and will not be repeatedly described herein.

Figure 5:
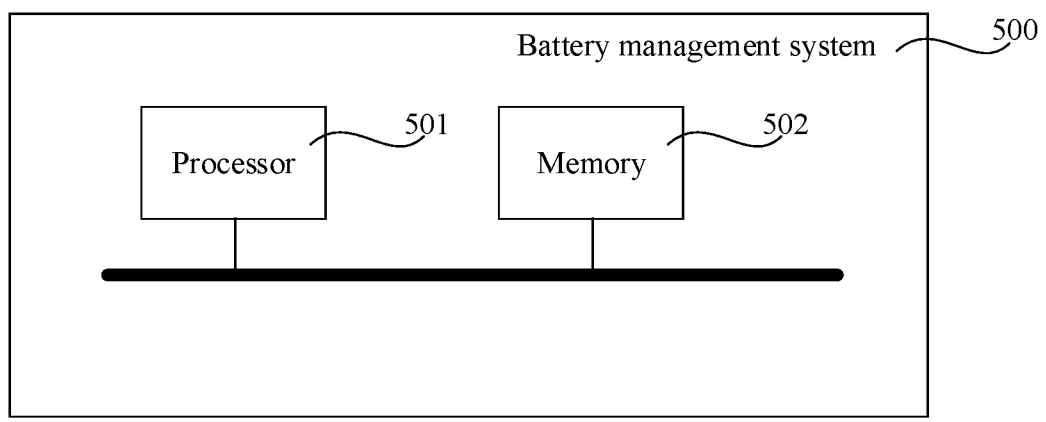
FIG. 5 is a structural diagram of a battery management system according to an embodiment of the present application.

Based on the same inventive concept, with reference to FIG. 5, the embodiments of the present application further provide a battery management system 500 including: a processor 501; and a memory 502 communicatively connected to the processor 501; where the memory 502 stores instructions executable by the process, and the instructions, when executed by the processor 501, enable the processor 501 to execute the method for battery SOC correction provided by the embodiments of the present application.

There is a direct or indirect electrical connection between the processor 501 and the memory 502 to enable the transfer or interaction of data. For example, the elements may be electrically connected via one or more communication buses or signal buses. The method for battery SOC correction includes at least one software functional module, which may be stored in the memory 502 in the form of software or firmware.

The processor 501 may be an integrated circuit chip having signal processing capabilities. The processor 501 may be a general-purpose processor, including a central processing unit (CPU), a network processor (NP), or the like. The processor 501 may also be a digital signal processor, an application specific integrated circuit, an off-the-shelf programmable gate array or other programmable logic device, a discrete gate or transistor logic device, a discrete hardware component. It may implement or perform the methods, steps and logic blocks disclosed in embodiments of the present application. The general-purpose processor may be a microprocessor, but in the alternative, the processor may be any conventional processor.

The memory 502 may store various software programs and modules, such as program instructions/modules corresponding to the method and the apparatus for battery SOC correction as provided by the embodiments of the present application. The processor 501 executes various functional applications and data processing by executing software programs and modules stored in the memory 502, that is, implementing the methods in the embodiments of the present application.

The memory 502 may include, but is not limited to, a random access memory (RAM), a read only memory (ROM), a programmable read-only memory (PROM), an erasable programmable read-only memory (EPROM), an electric erasable programmable read-only memory (EEPROM), etc.

Various implementations and specific examples of the method for battery SOC correction in the foregoing embodiments are equivalently applicable to the battery management system 500 shown in FIG. 5. From the foregoing detailed description of the method, the implementations of the battery management system 500 in FIG. 5 will be apparent to those skilled in the art, and will not be described in detail herein for the sake of brevity.

Based on the same inventive concept, the embodiments of the present application further provide a vehicle, which is an electric vehicle including a battery pack and the battery management system 500 shown in FIG. 5.

Based on the same inventive concept, the embodiments of the present application further provide an electrically powered device including a battery pack and the battery management system 500 shown in FIG. 5.

Based on the same inventive concept, the embodiments of the present application further provide a readable storage medium having stored thereon a computer program, where the computer program, when executed by a computer, performs the method for battery SOC correction provided by the embodiments of the present application.

While the present application has been described with reference to preferred embodiments, various modifications may be made and equivalents may be substituted for elements thereof without departing from the scope of the present application. In particular, the technical features mentioned in the various embodiments can be combined in any manner as long as there is no structural conflict. This application is not limited to the particular embodiments disclosed herein, but includes all technical solutions falling within the scope of the claims.

What is claimed is:

1. A method for battery SOC correction, comprising:
   acquiring a voltage-SOC variation curve of a battery during a charging process;
   generating a voltage differential curve of the battery according to the voltage-SOC variation curve, the voltage differential curve being a variation curve of a differential value with SOC, the differential value being a ratio of a voltage variation to a SOC variation corresponding to the voltage variation during the charging process;
   determining a peak point on the voltage differential curve, the peak point being between any two adjacent plateaus on the voltage-SOC variation curve and not located on the any two adjacent plateaus;
   performing SOC correction on the basis of the peak point,
   wherein the generating a voltage differential curve of the battery according to the voltage-SOC variation curve comprises:
   for each time,
      acquiring N incremental voltages on the voltage-SOC variation curve, recording moments corresponding to the N incremental voltages, and calculating SOC variations corresponding to the N incremental voltages, wherein N is a positive integer greater than or equal to 5, and
      calculating N−1 differential values on the basis of the N incremental voltages and the SOC variations corresponding to the N incremental voltages; and
   generating the voltage differential curve on the basis of the N−1 differential values calculated each time.

2. The method according to claim 1, wherein for N incremental voltages acquired for one time and N incremental voltages acquired for a subsequent time, first to (N−1)th incremental voltages of the N incremental voltages for the subsequent time are second to Nth incremental voltages of the N incremental voltages for the one time, respectively, and the Nth incremental voltage of the N incremental voltages for the subsequent time is a newly acquired incremental voltage.

3. The method according to claim 1, wherein for each time, before the calculating N−1 differential values on the basis of the N incremental voltages and the SOC variations corresponding to the N incremental voltages, the method further comprises:
   performing polynomial fitting on the N incremental voltages and the SOC variations corresponding to the N incremental voltages;
   correspondingly the calculating N−1 differential values on the basis of the N incremental voltages and the SOC variations corresponding to the N incremental voltages comprises:
   calculating the N−1 differential values on the basis of a result of the polynomial fitting.

4. The method according to claim 1, wherein the generating the voltage differential curve on the basis of the N−1 differential values calculated each time comprises:
   determining a differential valid value on the basis of the N−1 differential values calculated each time;
   generating the voltage differential curve on the basis of the differential valid value determined each time.

5. The method according to claim 1, wherein the determining a peak point on the voltage differential curve comprises:
   determining a first moment at which the voltage differential curve enters a first plateau of the two plateaus;

determining a second moment at which the voltage differential curve enters a second plateau of the two plateaus, the second moment being after the first moment;

determining, as the peak point, a point corresponding to a maximum differential value among differential values corresponding to respective moments between the first moment and the second moment.

6. The method according to claim 5, wherein the generating a voltage differential curve of the battery according to the voltage-SOC variation curve comprises:

for each time,
acquiring N incremental voltages on the voltage-SOC variation curve, recording moments corresponding to the N incremental voltages, and calculating SOC variations corresponding to the N incremental voltages, wherein N is a positive integer greater than or equal to 5, and calculating N−1 differential values on the basis of the N incremental voltages and the SOC variations corresponding to the N incremental voltages; and generating the voltage differential curve on the basis of the N−1 differential values calculated each time;

correspondingly the determining a first moment at which the voltage differential curve enters a first plateau of the two plateaus comprises:

determining whether a difference value between SOC increments corresponding to adjacent incremental voltages of the N incremental voltages acquired each time is greater than a preset second threshold;

determining a moment corresponding to a later one of the adjacent incremental voltages as the first moment, when the difference value between the SOC increments corresponding to the adjacent incremental voltages of the N incremental voltages acquired each time is greater than the preset second threshold.

7. The method according to claim 5, wherein the generating a voltage differential curve of the battery according to the voltage-SOC variation curve comprises:

for each time,
acquiring N incremental voltages on the voltage-SOC variation curve, recording moments corresponding to the N incremental voltages, and calculating SOC variations corresponding to the N incremental voltages, wherein N is a positive integer greater than or equal to 5, and calculating N−1 differential values on the basis of the N incremental voltages and the SOC variations corresponding to the N incremental voltages; and generating the voltage differential curve on the basis of the N−1 differential values calculated each time;

correspondingly the determining a first moment at which the voltage differential curve enters a first plateau of the two plateaus comprises:

determining a differential valid value among the N−1 differential values calculated each time;

determining whether a difference value between SOC increments corresponding to two adjacent differential valid values is greater than a preset third threshold;

determining a moment corresponding to a later one of the two adjacent differential valid values as the first moment, when the difference value between the SOC increments corresponding to the two adjacent differential valid values is greater than the preset third threshold.

8. The method according to claim 6, wherein the determining a second moment at which the voltage differential curve enters a second plateau of the two plateaus comprises:

determining whether a difference value between SOC increments corresponding to adjacent incremental voltages of N incremental voltages acquired each time after the first moment is greater than a preset fourth threshold;

determining a moment corresponding to a later one of the adjacent incremental voltages as the second moment, when the difference value between the SOC increments corresponding to the adjacent incremental voltages of the N incremental voltages is greater than the preset fourth threshold.

9. The method according to claim 6, wherein the determining a second moment at which the voltage differential curve enters a second plateau of the two plateaus comprises:

determining a differential valid value among N−1 differential values calculated each time after the first moment;

determining whether a difference value between SOC increments corresponding to two adjacent differential valid values is greater than a preset fifth threshold;

determining a moment corresponding to a later one of the two adjacent differential valid values as the second moment, when the difference value between the SOC increments corresponding to the two adjacent differential valid values is greater than the preset fifth threshold.

10. The method according to claim 1, wherein the performing SOC correction on the basis of the peak point comprises:

calibrating a SOC corresponding to the peak point, and determining the calibrated SOC corresponding to the peak point;

performing the SOC correction on the basis of a SOC increment corresponding to the peak point, the calibrated SOC corresponding to the peak point, and a SOC increment corresponding to a moment at which a correction is needed.

11. An apparatus for battery SOC correction, comprising at least one processor and a memory communicatively coupled to the at least one processor, wherein the memory comprises instructions executable by the at least one processor and stored in the memory, and the instructions, when executed by the at least one processor, enable the at least one processor to:

acquire a voltage-SOC variation curve of a battery during a charging process; and generate a voltage differential curve of the battery according to the voltage-SOC variation curve, the voltage differential curve being a variation curve of a differential value with SOC, the differential value being a ratio of a voltage variation to a SOC variation corresponding to the voltage variation during the charging process;

determine a peak point on the voltage differential curve, the peak point being between any two adjacent plateaus on the voltage-SOC variation curve and not located on the any two adjacent plateaus; correct the SOC on the basis of the peak point, wherein the instructions further enable the at least one processor to:

for each time,
acquire N incremental voltages on the voltage-SOC variation curve, recording moments corresponding to the N incremental voltages, and calculate SOC variations corresponding to the N incremental voltages, wherein N is a positive integer greater than or equal to 5, and
- calculate N−1 differential values on the basis of the N incremental voltages and the SOC variations corresponding to the N incremental voltages; and
- generate the voltage differential curve on the basis of the N−1 differential values calculated each time.

12. The apparatus according to claim 11, wherein for N incremental voltages acquired by the processing module for one time and N incremental voltages acquired by the processing module for a subsequent time, first to (N−1)th incremental voltages of the N incremental voltages for the subsequent time are second to Nth incremental voltages of the N incremental voltages for the one time, respectively, and the Nth incremental voltage of the N incremental voltages for the subsequent time is a newly acquired incremental voltage.

13. The apparatus according to claim 11, wherein the instructions further enable the at least one processor to:
- perform polynomial fitting on the N incremental voltages acquired each time and the SOC variations corresponding to the N incremental voltages; and
- calculate the N−1 differential values on the basis of a result of the polynomial fitting.

14. The apparatus according to claim 11, wherein the instructions further enable the at least one processor to: determine a differential valid value on the basis of the N−1 differential values calculated each time; generate the voltage differential curve on the basis of the differential valid value determined each time.

15. The apparatus according to claim 11, wherein the instructions further enable the at least one processor to:
- determine a first moment at which the voltage differential curve enters a first plateau of the two plateaus; determine a second moment at which the voltage differential curve enters a second plateau of the two plateaus, the second moment being after the first moment; determine, as the peak point, a point corresponding to a maximum differential value among differential values corresponding to respective moments between the first moment and the second moment.

16. The apparatus according to claim 15, wherein the instructions further enable the at least one processor to:
for each time,
- acquire N incremental voltages on the voltage-SOC variation curve, recording moments corresponding to the N incremental voltages, and calculate SOC variations corresponding to the N incremental voltages, wherein N is a positive integer greater than or equal to 5, and
- calculate N−1 differential values on the basis of the N incremental voltages and the SOC variations corresponding to the N incremental voltages; and
- generate the voltage differential curve on the basis of the N−1 differential values calculated each time;

and the processing module is further specifically configured to:
- determine whether a difference value between SOC increments corresponding to adjacent incremental voltages of the N incremental voltages acquired each time is greater than a preset second threshold;
- determine a moment corresponding to a later one of the adjacent incremental voltages as the first moment, when the difference value between the SOC increments corresponding to the adjacent incremental voltages of the N incremental voltages acquired each time is greater than the preset second threshold.

17. The apparatus according to claim 15, wherein the instructions further enable the at least one processor to:
for each time,
- acquire N incremental voltages on the voltage-SOC variation curve, recording moments corresponding to the N incremental voltages, and calculate SOC variations corresponding to the N incremental voltages, wherein N is a positive integer greater than or equal to 5, and
- calculate N−1 differential values on the basis of the N incremental voltages and the SOC variations corresponding to the N incremental voltages; and
- generate the voltage differential curve on the basis of the N−1 differential values calculated each time;
- determine a differential valid value among the N−1 differential values calculated each time;
- determine whether a difference value between SOC increments corresponding to two adjacent differential valid values is greater than a preset third threshold; and
- determine a moment corresponding to a later one of the two adjacent differential valid values as the first moment, when the difference value between the SOC increments corresponding to the two adjacent differential valid values is greater than the preset third threshold.

18. The apparatus according to claim 16, wherein the instructions further enable the at least one processor to:
- determine whether a difference value between SOC increments corresponding to adjacent incremental voltages of the N incremental voltages acquired each time after the first moment is greater than a preset fourth threshold;
- determine a moment corresponding to a later one of the adjacent incremental voltages as the second moment, when the difference value between the SOC increments corresponding to the adjacent incremental voltages of the N incremental voltages is greater than the preset fourth threshold.

* * * * *